(12) United States Patent
Yu et al.

(10) Patent No.: US 8,477,554 B2
(45) Date of Patent: Jul. 2, 2013

(54) SEMICONDUCTOR MEMORY DEVICE

(75) Inventors: Hak-soo Yu, Seongnam-si (KR); In-gyu Baek, Seoul (KR); Hong-sun Hwang, Suwon-si (KR); Young-kug Moon, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 98 days.

(21) Appl. No.: 13/152,316

(22) Filed: Jun. 3, 2011

(65) Prior Publication Data

US 2011/0305100 A1 Dec. 15, 2011

(30) Foreign Application Priority Data

Jun. 10, 2010 (KR) ........................ 10-2010-0055115

(51) Int. Cl.
*G11C 5/14* (2006.01)
*G11C 5/02* (2006.01)
*G11C 5/06* (2006.01)

(52) U.S. Cl.
USPC ............................ 365/226; 365/51; 365/63

(58) Field of Classification Search
USPC .............................................. 365/51, 63, 226
See application file for complete search history.

(56) References Cited

U.S. PATENT DOCUMENTS

| | | | |
|---|---|---|---|
| 6,594,171 B1 * | 7/2003 | Hogan | 365/52 |
| 7,492,569 B2 * | 2/2009 | Sakurabayashi et al. | 361/303 |
| 2009/0111232 A1 * | 4/2009 | Kim et al. | 438/296 |

FOREIGN PATENT DOCUMENTS

| | | |
|---|---|---|
| JP | 2005-136071 | 5/2005 |
| KR | 100827697 B1 | 4/2008 |
| KR | 1020090090601 A | 8/2009 |

* cited by examiner

*Primary Examiner* — Ly D Pham
(74) *Attorney, Agent, or Firm* — Volentine & Whitt, PLLC

(57) ABSTRACT

A semiconductor memory device including a plurality of layers each including a memory cell array and which are stacked over each other; and at least one power plane for supplying power to the layers. The power plane includes a region to which a power voltage is applied and a region to which a ground voltage is applied. The region to which a power voltage is applied is located adjacent to the region to which a ground voltage is applied, and forms a decoupling capacitor therebetween to decouple an influx of power noise to the layers or generation of power noise in the layers.

18 Claims, 20 Drawing Sheets

(a)

(b)

(a)

(b)

SEMICONDUCTOR MEMORY DEVICE

CROSS-REFERENCE TO RELATED APPLICATIONS

A claim of priority is made to Korean Patent Application No. 10-2010-0055115, filed on Jun. 10, 2010, the disclosure of which is incorporated herein in its entirety by reference.

BACKGROUND

The inventive concepts described herein are related to a semiconductor memory device, and more particularly, to a semiconductor memory device that has high power integrity due to inclusion of power planes corresponding to a plurality of layers.

Semiconductor memory devices can be highly integrated by forming a plurality of layers in a non-volatile memory device. However, in such semiconductor memory devices, the occurrence of unstable power supply to a plurality of the layers, power noise coupling, electromagnetic interference (EMI), and poor heat sink capabilities are concerns.

SUMMARY

The inventive concepts provide a semiconductor memory device having a plurality of layers, whereby power is smoothly and stably supplied to the plurality of layers.

In an exemplary embodiment of the inventive concepts, there is provided a semiconductor memory device including a plurality of layers each includes a memory cell array, the layers stacked over each other; and at least one power plane for supplying power to the layers, wherein the at least one power plane includes a first region to which a power voltage is applied and a second region to which a ground voltage is applied, wherein the first region is located adjacent to the second region, and the first and second regions form a decoupling capacitor therebetween to decouple an influx of power noise to the layers and decouple generation of power noise in the layers.

In the at least one power plane, the first region and the second region are alternately aligned in a same layer, interlaced with each other. Alternatively, in the at least one power plane, the first region and the second region are in different layers.

The layers include layers having different driving characteristics in terms of memory capacity, access time, or a combination thereof, and the at least one power plane is interposed between the layers having different driving characteristics. Alternatively, the layers are divided into a plurality of layer groups according to driving characteristics, and the at least one power plane is interposed between neighboring layer groups from among the layers. In this regard, the layer groups may include different numbers of layers having different sizes, may include unit arrays having different sizes, or may include different types of memory cell arrays.

The at least one power plane surrounds a portion of the stacked layers or completely surrounds the stacked layers. The at least one power plane is interposed between layers having different driving characteristics in terms of memory capacity, access time, or a combination thereof, and surrounds a portion of the stacked layers, or completely surrounds the stacked layers.

The semiconductor memory device may further include a control layer that includes control logic for controlling access to memory cell arrays of the layers, and a memory array driving circuit for driving memory cell arrays of the layers.

The semiconductor memory device may further include a control power plane for supplying power to the control layer, wherein the control power plane is interposed between the control layer and a layer from among the layers disposed closest to the control layer.

The power voltage and the ground voltage are directly applied to the control logic of the control layer, and the power voltage and the ground voltage are applied to the memory array driving circuit of the control layer through a control power plane for supplying power to the control layer, wherein the control power plane is interposed between the control layer and a layer from among the layers disposed closest to the control layer.

The semiconductor memory device may further include at least one ground plane which is interposed between two layers of the layers and to which a ground voltage is applied.

The ground plane is disposed adjacent to the at least one power plane.

The semiconductor memory device may further include a heat dissipation path which runs from the at least one power plane to outside the semiconductor memory device.

The power voltage and the ground voltage applied from the at least one power plane may be supplied from a power supply device disposed outside the semiconductor memory device.

The semiconductor memory device may further include a power line and a ground line through which the power voltage and the ground voltage are supplied to the at least one power plane, and the power line and the ground line are connected to a side or sides of the at least one power plane.

When the semiconductor memory device includes a plurality of the power planes, the power line and the ground line are commonly shared by the power planes.

When the semiconductor memory device includes a plurality of the power planes, the power line and the ground line are allocated to each of the power planes, and the power line and the ground line are through-silicon-vias and are connected to a power plane disposed higher than the other power planes.

According to another example embodiment of the inventive concepts, there is provided a computing system including a semiconductor memory device including a plurality of layers each includes a memory cell array, the layers stacked over each other; and at least one power plane for supplying power to the layers, wherein the at least one power plane includes a first region to which a power voltage is applied and a second region to which a ground voltage is applied, wherein the first region is located adjacent to the second region, and the first and second regions form a decoupling capacitor therebetween to decouple an influx of power noise to the layers and decouple generation of power noise in the layers.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
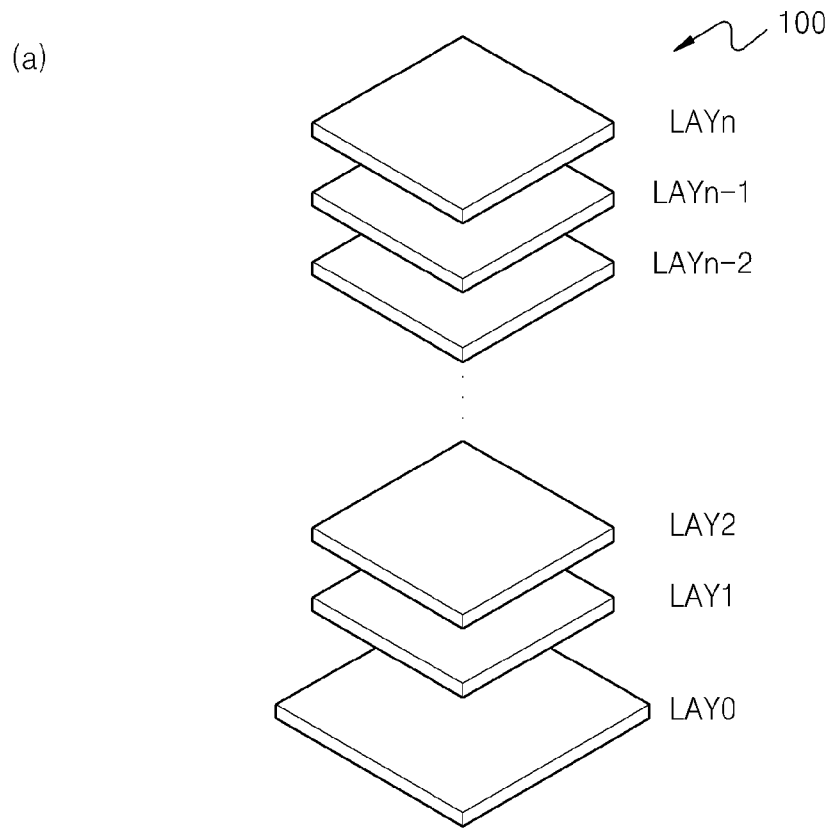
FIG. 1 is a view of a semiconductor memory device according to an example embodiment of the inventive concept.
Figure 1:
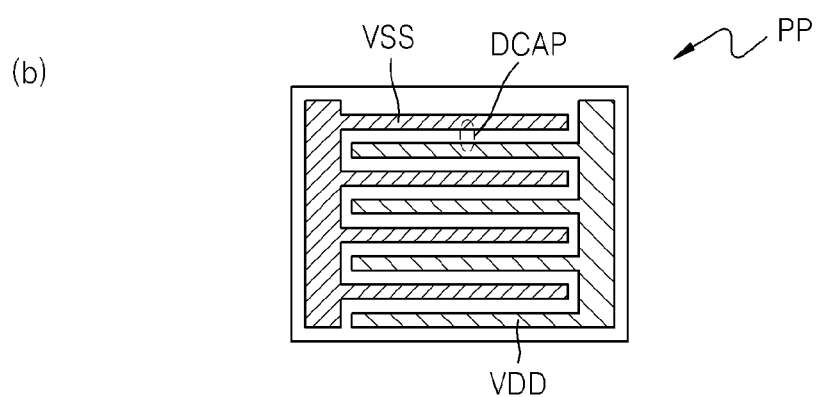

The attached drawings for illustrating embodiments of the inventive concepts are referred to in order to gain a sufficient understanding of the inventive concepts, the merits thereof, and the objectives accomplished by the implementation of the inventive concepts.

Hereinafter, the inventive concepts will be described in detail by explaining preferred embodiments with reference to the attached drawings. Like reference numerals in the drawings denote like elements.

FIG. 1 is a view of a semiconductor memory device 100 according to an example embodiment of the inventive concepts.

Referring to FIG. 1(a), the semiconductor memory device 100 according to the example embodiment may include n+1 layers LAY0 through LAYn where n is a natural number of two or more. The layers LAY0 through LAYn may include control logic or a memory cell array. In detail, from among the layers LAY0 through LAYn, the lowermost layer may be a control layer LAY0 including a memory controller, and the other layers LAY1 through LAYn may each include a memory cell array.

The semiconductor memory device 100 of FIG. 1(a) includes at least one power plane, for example, a power plane PP illustrated in FIG. 1(b), in order to supply power to the layers LAY0 through LAYn. The semiconductor memory device 100 according to the example embodiment includes the power plane PP of FIG. 1(b), in which a decoupling capacitor DCAP is formed between a region to which a ground voltage VSS is applied and a region to which a power voltage VDD is applied.

Since the decoupling capacitor DCAP is formed between the region to which a ground voltage VSS is applied and the region to which a power voltage VDD is applied in the power plane PP, power noise generated between the layers LAY0 through LAYn of the semiconductor memory device 100 may be decoupled.

In detail, in FIG. 1(b), the region to which the ground voltage VSS is applied and the region to which the power voltage VDD is applied are alternately aligned in the same layer, thereby being interlaced. The decoupling capacitor DCAP is formed between the region to which the ground voltage VSS is applied and the region to which the power voltage VDD is applied. However, the structure of the power plane PP is not limited thereto.

Figure 2:
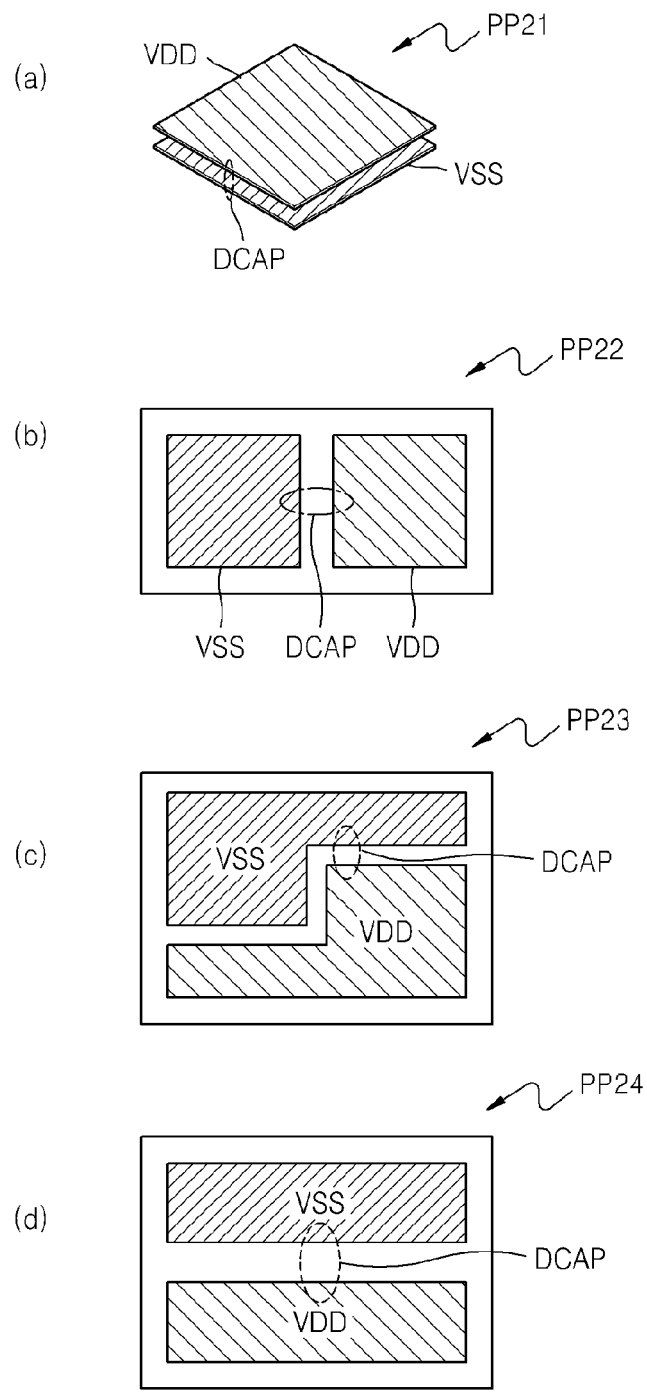
FIG. 2 is a view of an example of a power plane illustrated in FIG. 1.

FIG. 2(a) illustrates a power plane PP21 as another example of the power plane included in the semiconductor memory device 100 of FIG. 1(a). According to the power plane PP21, a power voltage VDD and a ground voltage VSS are applied to neighboring layers, respectively. In this regard, a decoupling capacitor DCAP may be formed between the neighboring layers to which the power voltage VDD and the ground voltage VSS are applied. FIG. 2(b) illustrates a power plane PP22 as another example of the power plane, and according to the power plane PP22, a power voltage VDD and a ground voltage VSS may be respectively applied to neighboring regions in the same layer. According to other examples, the neighboring regions in the same layer may have various shapes as those of power planes PP23 and PP24 illustrated in FIGS. 2(c) and 2(d).

In this regard, a decoupling capacitor DCAP may be formed between the region to which a power voltage VDD is applied and the region to which a ground voltage VSS is applied.

As described above, the power plane may have various structures. However, for ease of description, only the power plane PP of FIG. 1(b) will be described in detail unless clearly indicated otherwise.

Referring to FIG. 1, as described above, the semiconductor memory device 100 according to the example embodiment includes the power plane PP including the decoupling capacitor DCAP formed between the region to which a ground voltage VSS is applied and the region to which a power voltage VDD is applied, thereby, decoupling power noise generated in the semiconductor memory device 100. Hereinafter, semiconductor memory devices, including power planes, according to example embodiments will be described in detail.

Figure 3:
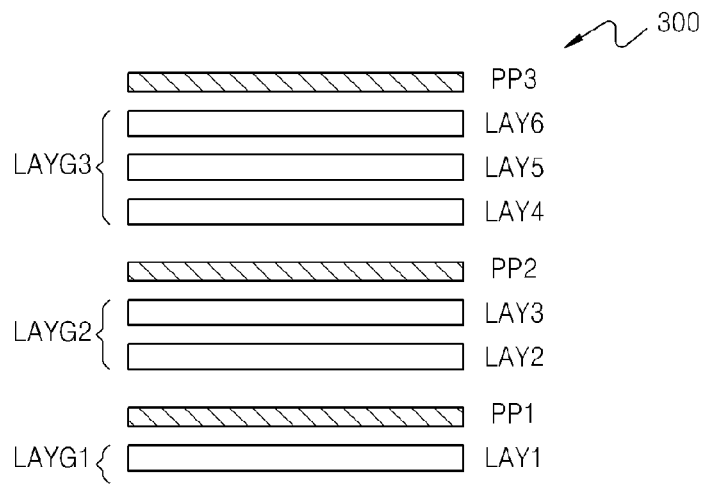
FIG. 3 is a view of an example of the semiconductor memory device of FIG. 1.

FIG. 3 is a view of an example of the semiconductor memory device 100 of FIG. 1A.

Referring to FIG. 3, a semiconductor memory device 300 according to this example embodiment includes first through third layer groups LAYG1 through LAYG3 including first through third power planes PP1 through PP3, respectively. For example, the first power plane PP1 may supply power to the first layer group LAYG1, the second power plane PP2 may supply power to the second layer group LAYG2, and the third power plane PP3 may supply power to the third layer group LAYG3.

In the semiconductor memory device 300 of FIG. 3, the first through third layer groups LAYG1 through LAYG3 have different numbers of layers. That is, the first layer group LAYG1 includes one layer, namely a first layer LAY1, the second layer group LAYG2 includes two layers, namely second and third layers LAY2 and LAY3, and the third layer group LAYG3 includes three layers, namely fourth through sixth layers LAY4 through LAY6. However, the structure of the semiconductor memory device 300 is not limited thereto. For example, the semiconductor memory device 300 may include a plurality of layer groups each including the same number of layers. In other embodiments, the semiconductor memory device 300 may also include two, four or more layer groups and each of the groups may include various numbers of layers.

Referring to FIG. 3, each of the first through third power planes PP1 through PP3 is interposed between a corresponding layer group and a layer group neighboring the corresponding layer group. For example, the first power plane PP1 for supplying power to the first layer group LAYG1 may be located between the first layer group LAYG1 and the second layer group LAYG2. The second power plane PP2 may be located between the second layer group LAYG2 and the third layer group LAYG3.

The first through third layer groups LAYG1 through LAYG3 of FIG. 3 may have different driving characteristics from each other. That is, the first through third layer groups LAYG1 through LAYG3 of FIG. 3 may have different driving characteristics in terms of memory capacity, excess time, or a combination thereof, as will be described in detail later.

As described above, when the first through third layer groups LAYG1 through LAYG3 have different driving characteristics, due to the different driving characteristics, power noise may occur among the first through third layer groups LAYG1 through LAYG3.

In addition, from among a plurality of layers, layers having simultaneous access may be set to belong to different layer groups. For example, if the first layer LAY1 and the third layer LAY3 have simultaneous access, the first layer LAY1 may be set to belong to the first layer group LAYG1 and the third layer LAY3 may be set to belong to the third layer group LAYG3.

A power voltage VDD and a ground voltage VSS are applied to each of the first through third power planes PP1 through PP3 of FIG. 3. Hereinafter, an operation of applying the power voltage and the ground voltage to each of the first through third power planes PP1 through PP3, according to various example embodiments, will be described.

Figure 4:
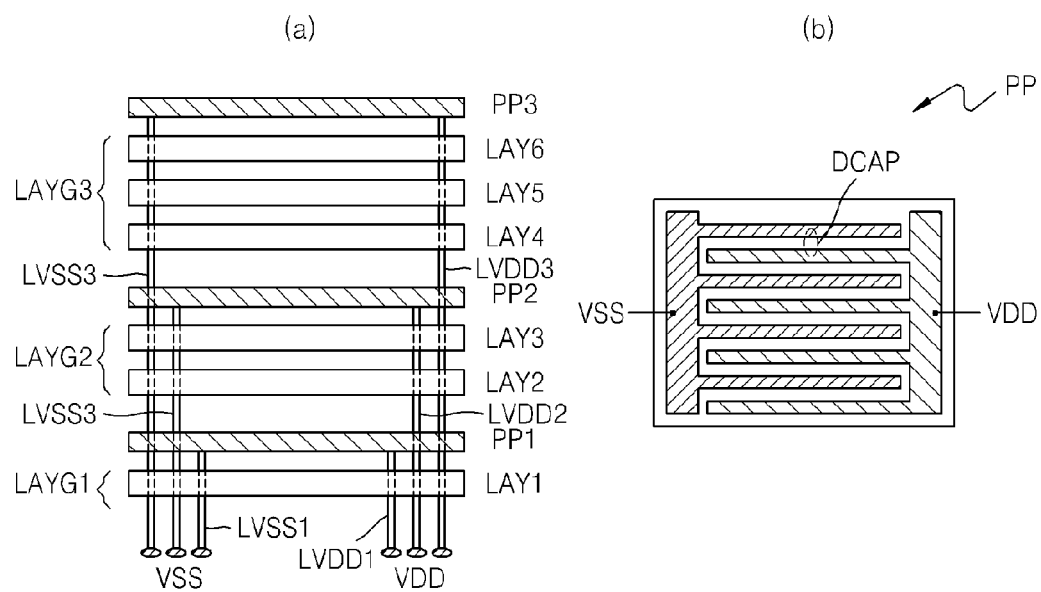
FIGS. 4 through 7 are views for explaining an operation of applying a power voltage and a ground voltage to a power plane illustrated in FIG. 3, according to example embodiments of the inventive concept.

FIG. 4 shows views for explaining an operation of applying a power voltage VDD and a ground voltage VSS to the first through third power planes PP1 through PP3 of FIG. 3, according to an example embodiment of the inventive concepts.

Referring to FIG. 4, a power voltage VDD may be applied on one side of first through third power planes PP1 through PP3, and a ground voltage VSS may be applied on another side of the first through third power planes PP1 through PP3. In FIG. 4(a), different power voltages VDD and different ground voltages VSS are applied to the first through third power planes PP1 through PP3, respectively. In this regard, through first through third power lines LVDD1 through LVDD3 and first through third ground lines LVSS1 through LVSS3 passing through a power plane disposed under a corresponding power plane, a power voltage VDD or a ground voltage VSS is applied to a corresponding power plane. For example, each of the first through third power lines LVDD1 through LVDD3 and the first through third ground lines LVSS1 through LVSS3 may be a through-silicon-via (TSV) to pass through a power plane disposed under a corresponding power plane.

For example, a power voltage VDD and a ground voltage VSS may be applied to the first power plane PP1 through the first power line LVDD1 and the first ground line LVSS1, respectively. A power voltage VDD and a ground voltage VSS may be applied to the second power plane PP2 through the second power line LVDD2 and the second ground line LVSS2, respectively. A power voltage VDD and a ground voltage VSS may be applied to the third power plane PP3 through the third power line LVDD3 and the third ground line LVSS3, respectively.

In this regard, the second power line LVDD2 and the second ground line LVSS2 pass through the first power plane PP1 disposed under the second power plane PP2, thereby allowing a power voltage VDD and a ground voltage VSS to be applied to the second power plane PP2 therethrough, respectively. The third power line LVDD3 and the third ground line LVSS3 pass through the first power plane PP1 and the second power plane PP2 disposed under the third power plane PP3, thereby allowing a power voltage VDD and a ground voltage VSS to be applied to the third power plane PP3 therethrough, respectively. As described above, each of the second power line LVDD2, the second ground line LVSS2, the third power line LVDD3, and the third ground line LVSS3 may be a TSV.

In FIG. 4(a), the first through third power lines LVDD1 through LVDD3 and the first through third ground lines LVSS1 through LVSS3 also pass through the layers LAY1 through LAY6. However, the structures of the first through third power lines LVDD1 through LVDD3 and the first through third ground lines LVSS1 through LVSS3 are not limited thereto. An embodiment in which the first through third power lines LVDD1 through LVDD3 and the first through third ground lines LVSS1 through LVSS3 pass through only the first through third power planes PP1 through PP3 will be described later.

In regard to the first through third power planes PP1 through PP3 illustrated in FIG. 4A, as illustrated in FIG. 4B, a power voltage VDD may be applied on one side of the first through third power planes PP1 through PP3 and a ground voltage VSS may be applied on another side of the first through third power planes PP1 through PP3.

Figure 5:
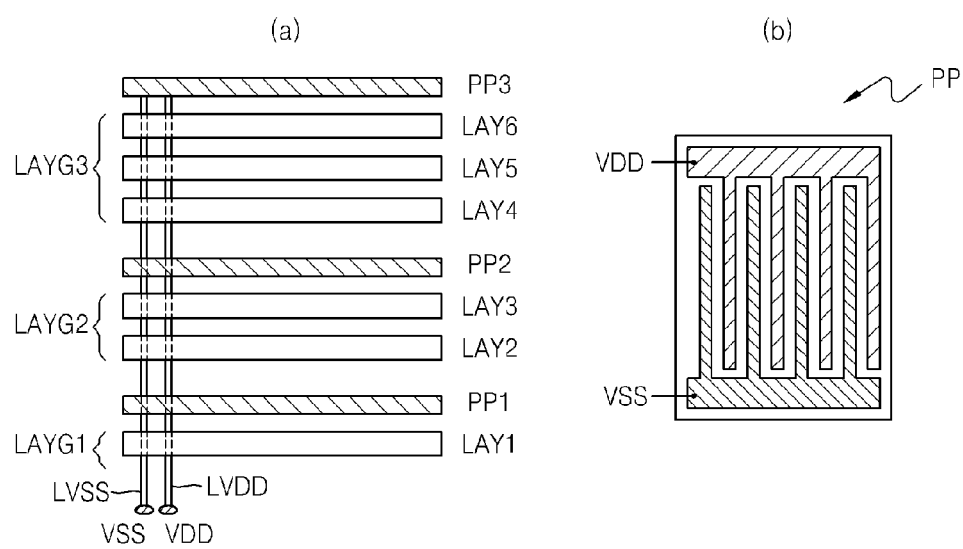

FIG. 5 shows views for explaining an operation of applying a power voltage VDD and a ground voltage VSS to the first through third power planes PP1 through PP3 of FIG. 3, according to another example embodiment of the inventive concepts.

Referring to FIG. 5(a), unlike the semiconductor memory device shown in FIG. 4(a), the first through third power planes PP1 through PP3 may commonly include one power line LVDD and one ground line LVSS. For example, a power voltage VDD is applied to the first through third power planes PP1 through PP3 through one power line LVDD, and a ground voltage VSS is applied to the first through third power planes PP1 through PP3 through one ground line LVSS.

In addition, the power voltage VDD and the ground voltage VSS may be applied on one side of the first through third power planes PP1 through PP3. As shown in FIG. 5(b), the power voltage VDD and the ground voltage VSS all may be applied on the same side of the first through third power planes PP1 through PP3 of FIG. 5(a).

Regarding the semiconductor memory device of FIG. 5, like the semiconductor memory device of FIG. 4, each of the power line LVDD and the ground line LVSS may be a TSV, thereby reaching a power plane disposed above a corresponding power plane.

Hereinbefore, embodiments in which a power line and a ground line are TSVs and are connected to a power plane disposed above a corresponding power plane have been described. However, the inventive concepts are not limited thereto.

Figure 6:
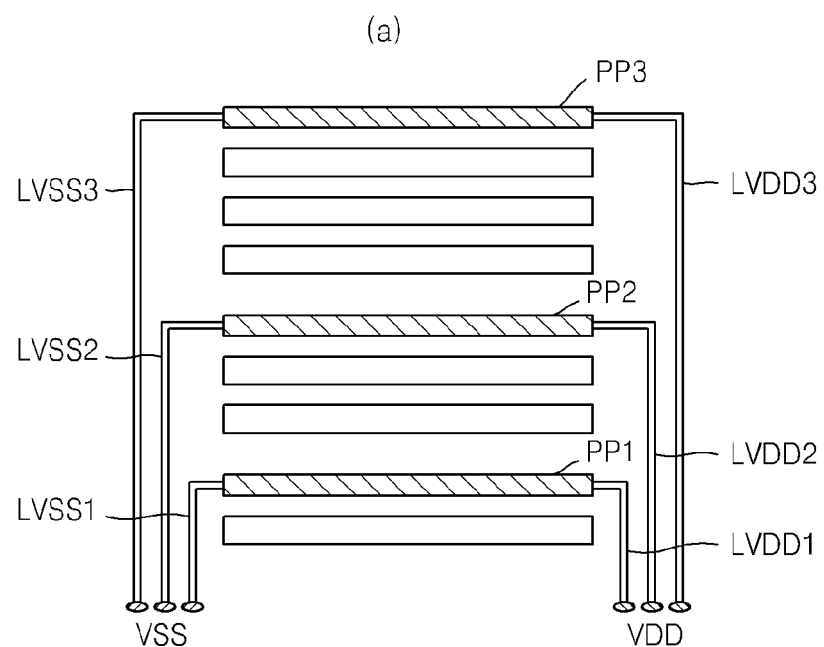
Figure 6:
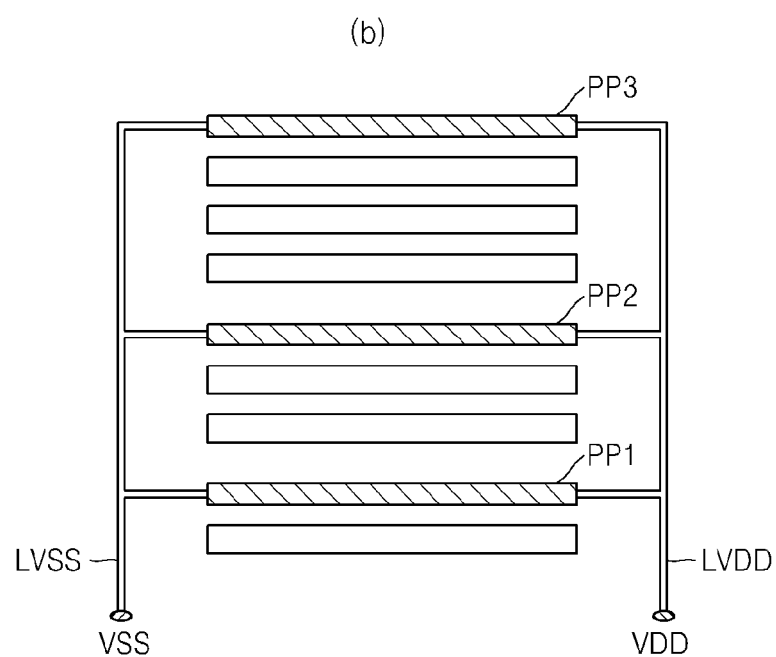

FIGS. 6(a) and 6(b) are views for explaining an operation of applying a power voltage VDD and a ground voltage VSS to the first through third power planes PP1 through PP3 of FIG. 3, according to other example embodiments of the inventive concepts. Referring to FIGS. 6(a) and 6(b), a power line and a ground line are not TSVs. Referring to FIG. 6(a), a power voltage VDD and a ground voltage VSS are applied to the first through third power planes PP1 through PP3 through power lines LVDD1 through LVDD3 and ground lines LVSS1 through LVSS3 which are respectively connected to the first through third power planes PP1 through PP3 from the outside. Also, referring to FIG. 6(b), a power voltage VDD and a ground voltage VSS are applied to the first through third power planes PP1 through PP3 through a power line LVDD and a ground line LVSS which are connected to the first through third power planes PP1 through PP3 from the outside.

Figure 7:
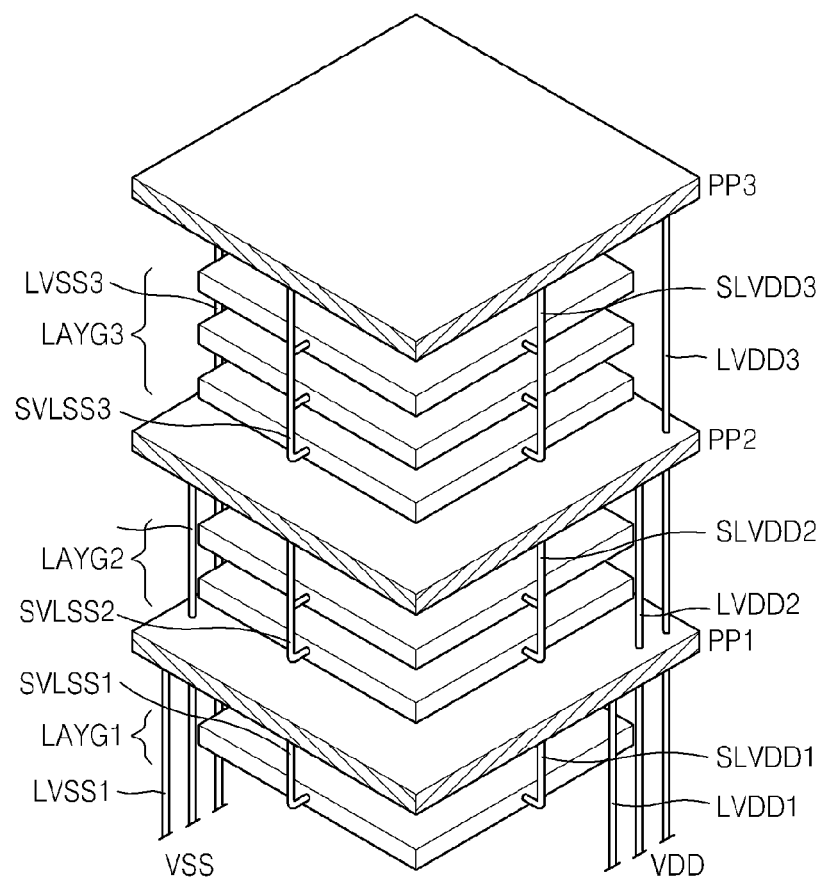

FIG. 7 shows a view for explaining an operation of applying a power voltage VDD and a ground voltage VSS to the first through third power planes PP1 through PP3 of FIG. 3, according to another example embodiment of the inventive concepts.

Referring to FIG. 7, a power voltage VDD is applied on one side of the first through third power planes PP1 through PP3, and a ground voltage VSS is applied on another side of the first through third power planes PP1 through PP3. In addition, different power voltages VDD and different ground voltages VSS are applied to the first through third power planes PP1 through PP3, respectively. In this regard, the first through third power lines LVDD1 through LVDD3 and the first through third ground lines LVSS1 through LVSS3 pass through a power plane located under a corresponding power plane, thereby allowing a power voltage VDD and a ground voltage VSS to be applied to the corresponding power plane.

In FIG. 7, a power voltage VDD and a ground voltage VSS are applied to corresponding first through third layer groups LAYG1 through LAYG3 by the respective first through third power planes PP1 through PP3. In detail, the first power plane PP1 may apply a power voltage VDD and a ground voltage VSS to the first layer group LAYG1 through a first sub power line SLVDD1 and a first sub ground line SLVSS1, respectively. The second power plane PP2 may apply a power voltage VDD and a ground voltage VSS to the second layer group LAYG2 through a second sub power line SLVDD2 and a second sub ground line SLVSS2, respectively. Likewise, the third power plane PP3 may apply a power voltage VDD and a ground voltage VSS to the third layer group LAYG3 through a third sub power line SLVDD3 and a third sub ground line SLVSS3, respectively.

Although in FIG. 4 the applying of a power to a corresponding layer by the respective power planes is not described, one of ordinary skill in the art may carry out the applying operation without undue difficulty with reference to the description presented in connection with FIG. 7.

As described above, in a semiconductor memory device according to an example embodiment of the inventive concepts, a power voltage VDD and a ground voltage VSS may be applied to a corresponding power plane in various ways. Hereinafter, for ease of description, the application of a power voltage VDD and a ground voltage VSS to a corresponding power plane as illustrated in FIG. 7 will be described in detail.

Referring to FIG. 3, as described above, the first through third layer groups LAYG1 through LAYG3 illustrated in FIG. 3 may have different driving characteristics. In this regard, the first through third layer groups LAYG1 through LAYG3 may have the following driving characteristics.

The first layer group LAYG1, which is closest to the control layer LAY0, may include at least one array (a storage region) that has a small memory capacity and a short access time. That is, data that has a small size and a high access frequency may be stored in the first layer group LAYG1. Accordingly, the first layer group LAYG1 may function as, for example, registers or a cache memory.

The third layer group LAYG3, which is farthest from the control layer LAY0, may include at least one array that has a large memory capacity and a long access time. That is, data that has a large size and a low access frequency may be stored in the third layer group LAYG3. Accordingly, the third layer group LAYG3 may function as, for example, a main memory.

The second layer group LAYG2, which is farther from the control layer LAY0 than the first layer group LAYG1 and closer to the control layer LAY0 than the third layer group LAYG3, may include at least one array that has a memory capacity that is larger than the first layer group LAYG1 and smaller than the third layer group LAYG3 and an access time that is longer than the first layer group LAYG1 and shorter than the third layer group LAYG3. Accordingly, the second layer group LAYG2 may function as, for example, a cache memory or a main memory.

Figure 8:
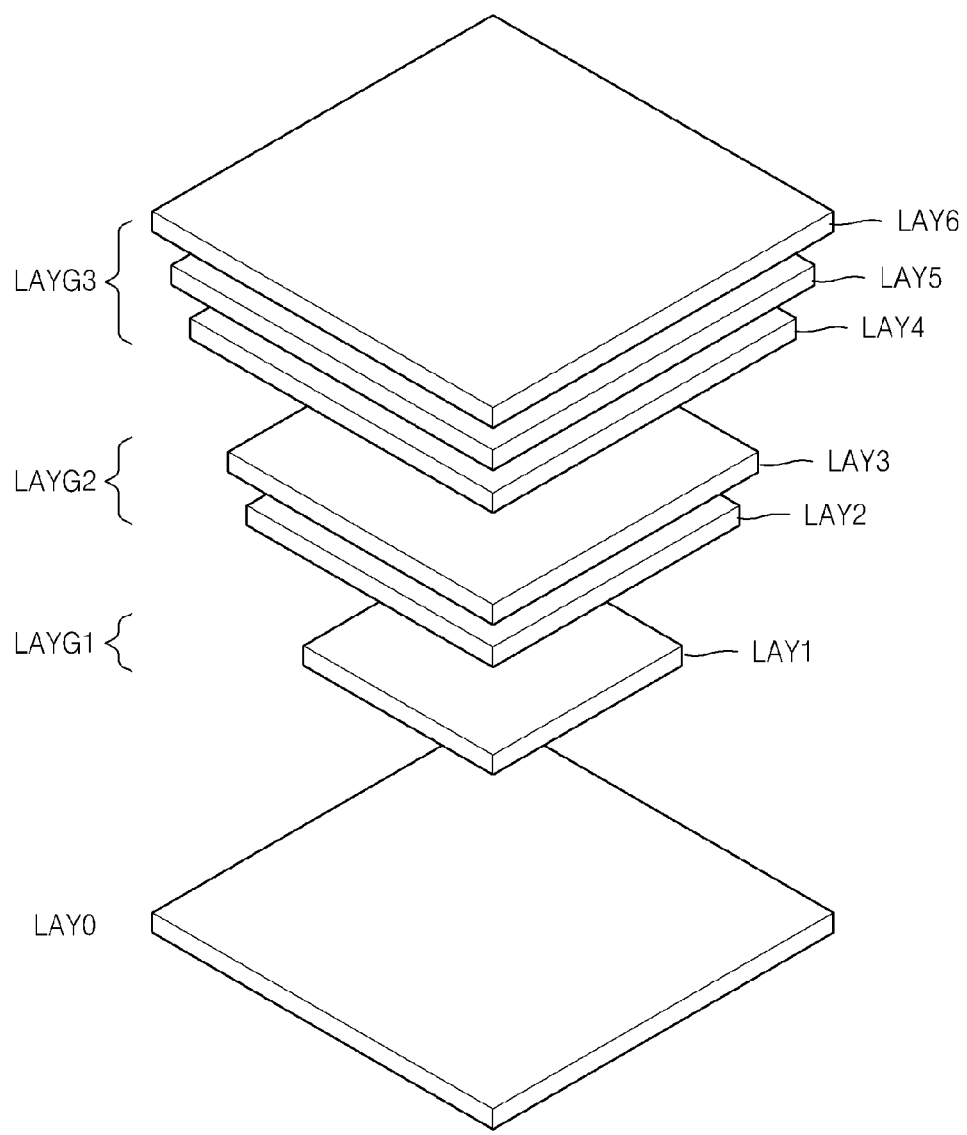
FIGS. 8 and 9 show various structures of layer groups illustrated in FIG. 3.
Figure 9:
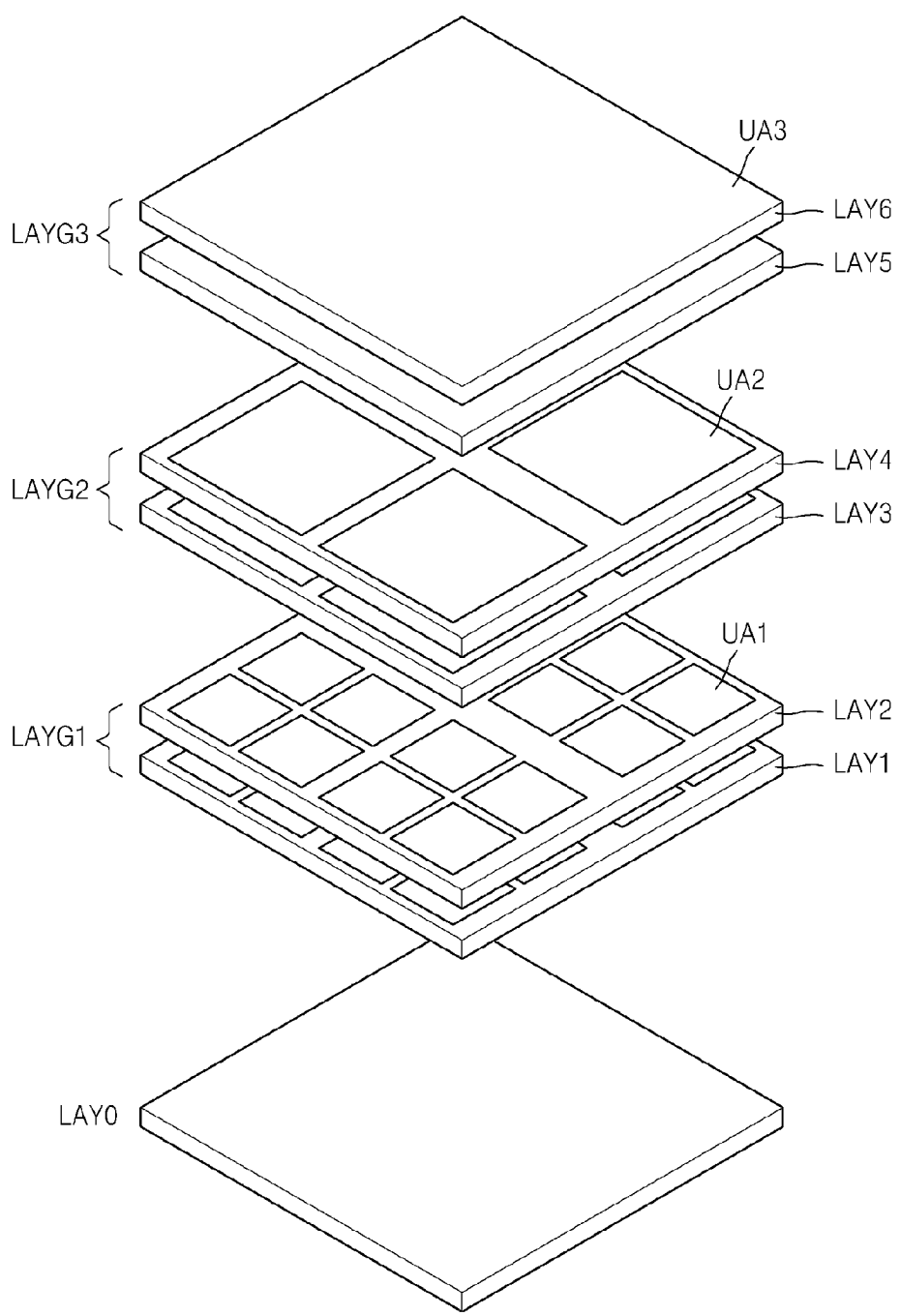

As described above, memory arrays included in the first through third layer groups LAYG1 through LAYG3 according to an example embodiment of the inventive concepts may have different capacities and access times. To do this, as illustrated in FIG. 8 showing a structure of the first through third layer groups LAYG1 through LAYG3, according to an example embodiment of the inventive concepts, the farther away a layer group is from the control layer LAY0, the layer group has more or larger layers. Alternatively, as illustrated in FIG. 9 showing a structure of the first through third layer groups LAYG1 through LAYG3, according to another example embodiment of the inventive concepts, the farther away a layer group is from the control layer LAY0, the layer group has a larger unit array. In this regard, the unit array is a portion of a memory cell array included in each layer that is formed by dividing the memory cell array in a given size.

For example, as illustrated in FIG. 8, the first layer group LAYG1, which is closest to the control layer LAY0, may include a first layer LAY1, and the third layer group LAYG3, which is farthest from the control layer LAY0, may include three layers, namely fourth through sixth layers LAY4 through LAY6. In this regard, the fourth through sixth layers LAY4 through LAY6 of the third layer group LAYG3 may be larger than the first layer LAY1 of the first layer group LAYG1. In addition, as illustrated in FIG. 9, a unit array UA3 included in the third layer group LAYG3 which is farthest from the control layer LAY0 may be larger than a unit array UA1 of the first layer group LAYG1 which is closest to the control layer LAY0.

Furthermore, although not limited herein, the first through third layer groups LAYG1 through LAYG3 according to an example embodiment of the inventive concepts may include various other numbers or sizes of layers in order to have such characteristics. In addition, the first through third layer groups LAYG1 through LAYG3 may also include different kinds of memory cell arrays. For example, the first layer group LAYG1 may include SRAM, etc., the second layer group LAYG2 may include DRAM, PRAM, STTMRAM, etc., and the third layer group LAYG3 may include a flash memory.

Figure 10:
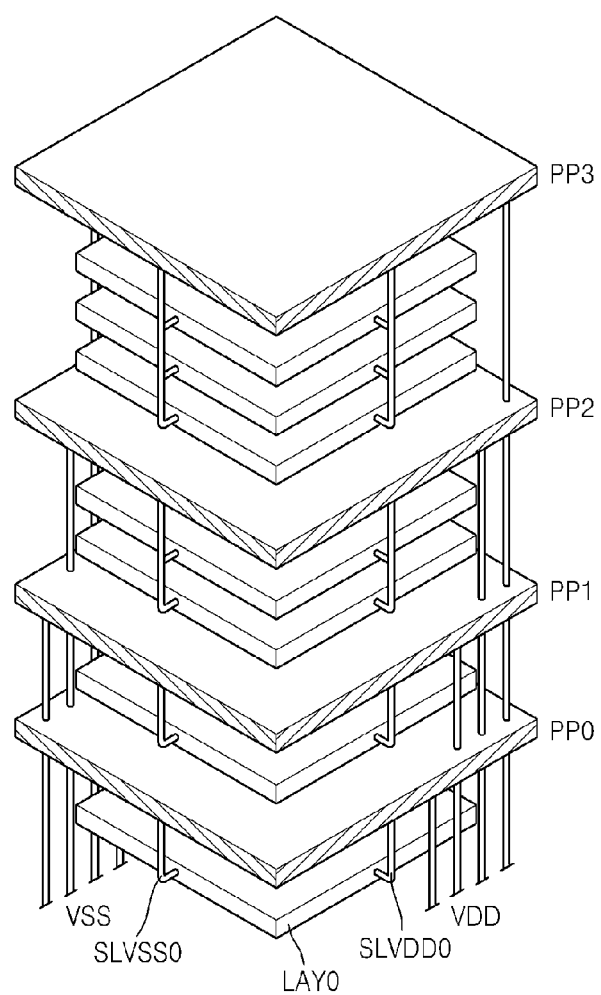
FIGS. 10 through 12 show examples of a control layer illustrated in FIG. 1.

Hereinbefore, a description has been made about power supply to layers including memory cell arrays. FIG. 10 illustrates an example of the control layer LAY0 of the semiconductor memory device 100 of FIG. 1A. Referring to FIG. 10, power may be supplied to the control layer LAY0 in the same manner as layers including memory cell arrays. That is, a control power plane PP0 for supplying power to the control layer LAY0 may be interposed between the control layer LAY0 and the first layer group LAYG1. The control power plane PP0 for supplying power to the control layer LAY0, like the first through third power planes PP1 through PP3, supplies power to the control layer LAY0 through a sub power line SLVDD0 and a sub ground line SLVSS0.

Figure 11:
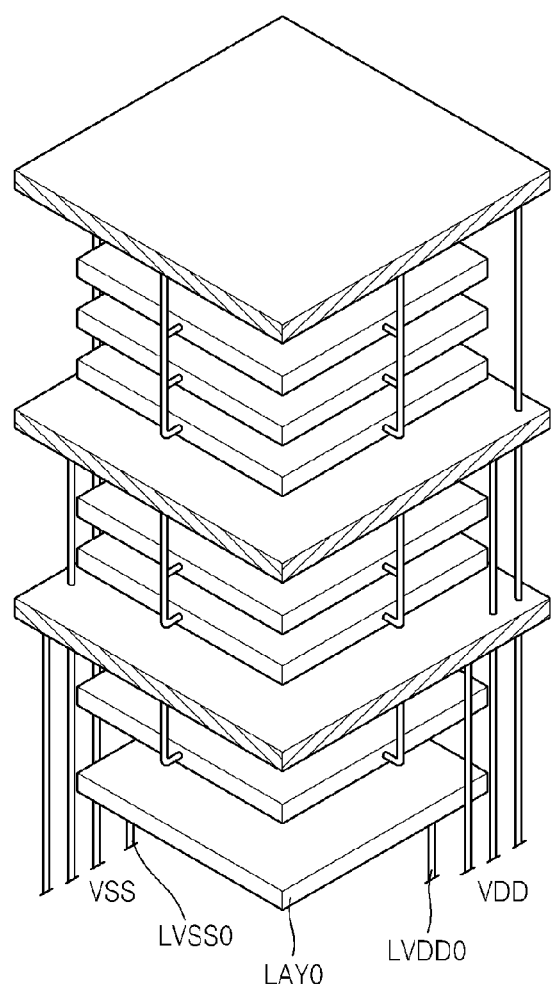

Alternatively, as illustrated in FIG. 11 showing another example of the control layer LAY0 of the semiconductor memory device 100 of FIG. 1A, a power voltage VDD and a ground voltage VSS may be directly applied to the control layer LAY0 through a power line LVDD0 and a ground line LVSS0, without use of a separate power plane for the control layer LAY0.

However, the control layer LAY0 is not limited to the embodiments described above.

Figure 12:
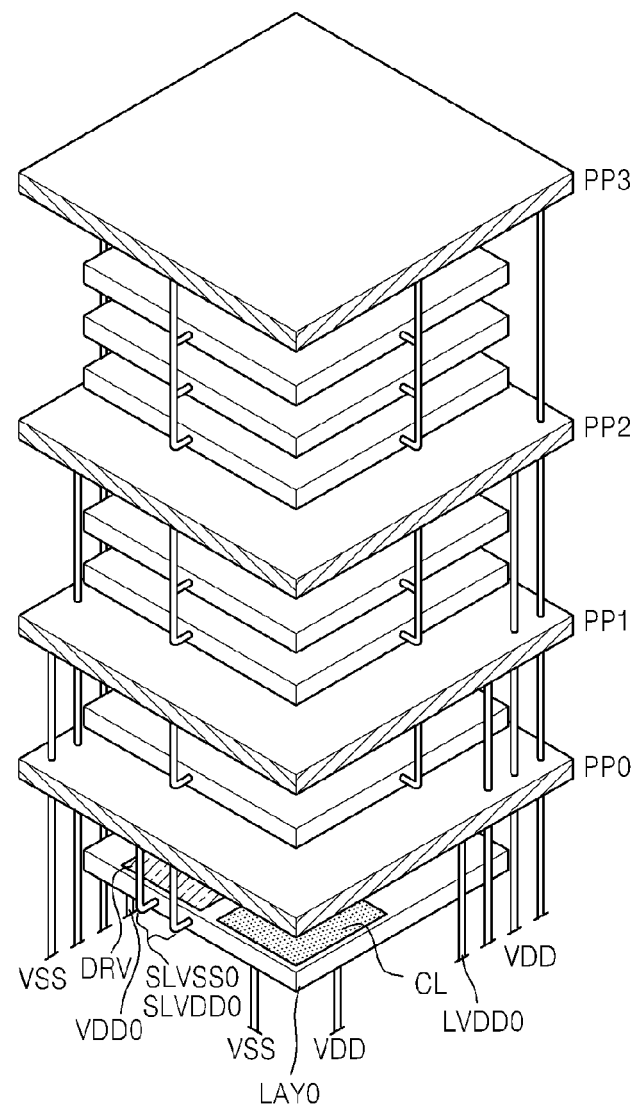

FIG. 12 illustrates another example of the control layer LAY0 of the semiconductor memory device 100 of FIG. 1A.

Referring to FIG. 12, the control layer LAY0 includes a control logic CL including a controller for controlling an access to the respective layers and a memory array driving circuit DRV for driving memory cell arrays respectively included in the layers. The control logic CL and the memory array driving circuit DRV may be separately supplied with power. For example, as illustrated in FIG. 12, a power voltage VDD and a ground voltage VSS may be directly applied to the control logic CL. On the other hand, in regard to the memory array driving circuit DRV, a control power plane PP0 interposed between the control layer LAY0 and the first layer group LAYG1 may apply a power voltage VDD and a ground voltage VSS to the memory array driving circuit DRV. In detail, the control power plane PP0 may apply a power voltage VDD and a ground voltage VSS, which are respectively applied through a power line LVDD0 and a ground line LVSS0, to the memory array driving circuit DRV through a sub power line SLVDD0 and a sub ground line SLVSS0.

Figure 13:
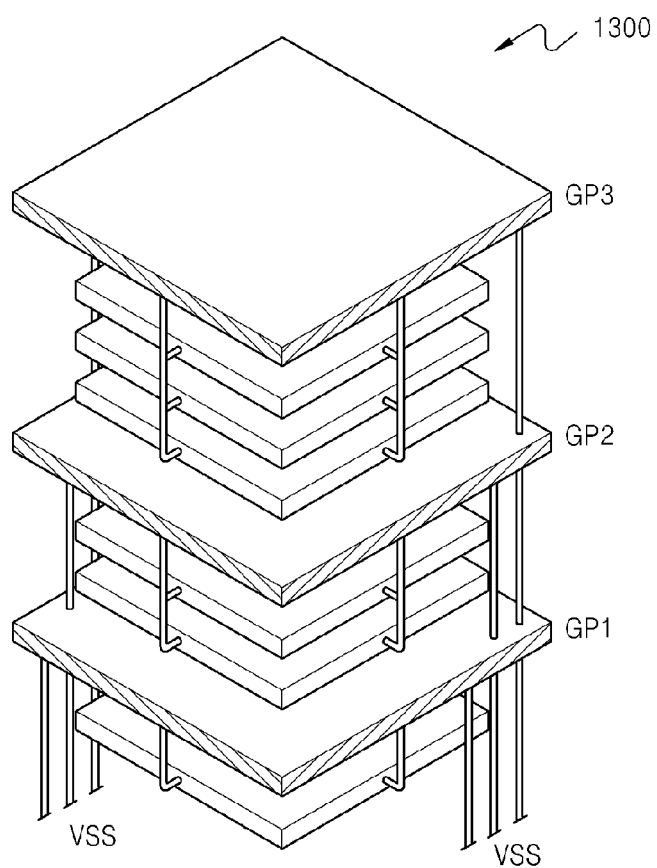
FIG. 13 is a view of another example of the semiconductor memory device of FIG. 1.

FIG. 13 is a view of another example of the semiconductor memory device 100 of FIG. 1(a).

Referring to FIG. 13, a semiconductor memory device 1300 according to this example embodiment includes, in addition to one or more power planes PP of FIG. 1(b) (which are not shown in FIG. 13), one or more ground planes GP1 through GP3 to which a ground voltage VSS is applied and which are interposed between layers or first through third layer groups LAYG1 through LAYG3. In the semiconductor memory device 1300 according to this example embodiment, one or more ground planes GP1 through GP3 may be interposed between the layers (such as between any of first through sixth layers LAY1 through LAY6 as described previously) or the layer groups (such as between any of first through third layer groups LAYG1 through LAYG3), so as to prevent electromagnetic interference (EMI) that may occur in a layer or may inflow into a layer. The semiconductor memory device 1300 of FIG. 13 may include the power planes PP of FIG. 1(b), as shown in FIG. 3.

Figure 14:
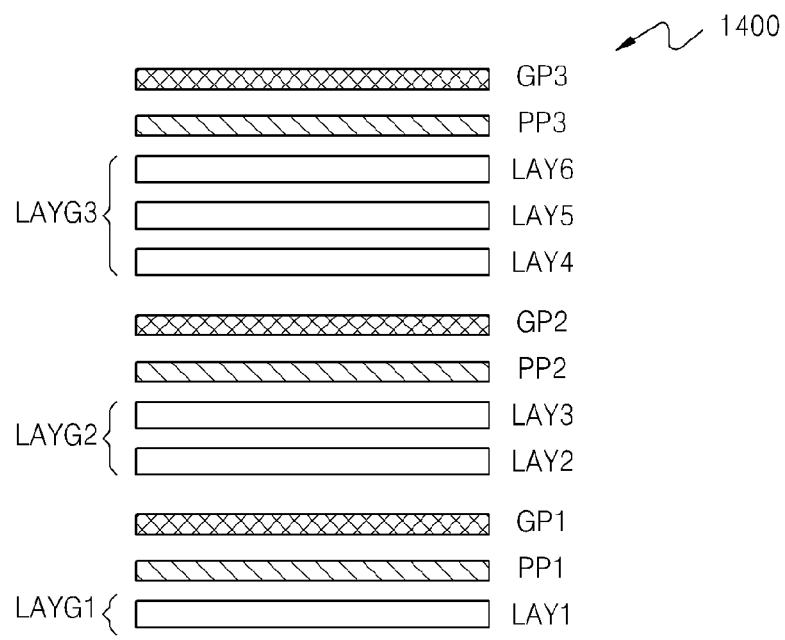
FIG. 14 is a view of another example of the semiconductor memory device of FIG. 1.

FIG. 14 is a view of another example embodiment of the semiconductor memory device 100 of FIG. 1(a). Referring to FIG. 14, a semiconductor memory device 1400 according to this example embodiment includes layer groups LAYG1 through LAYG3, power planes PP1 through PP3, and ground planes GP1 through GP3, in which one power plane and one ground plane are interposed between adjacent layer groups.

Referring back to FIG. 13, the semiconductor memory device 1300 commonly shares the ground planes GP1 through GP3 and a ground voltage VSS is applied on sides of the ground planes GP1 through GP3. However, the structure of the semiconductor memory device 1300 is not limited thereto. As described with FIGS. 4 through 7, a ground voltage Vss may be applied to ground planes GP1 through GP3 in various other ways.

Hereinbefore, semiconductor memory devices according to various example embodiments of the inventive concepts that are capable of minimizing power noise and/or EMI due to inclusion of power planes and/or ground planes interposed between layers or layer groups has been described. Hereinafter, semiconductor memory devices that include power planes and/or ground planes outside stacked layers, according to example embodiments of the inventive concept, will be described in detail.

Figure 15:
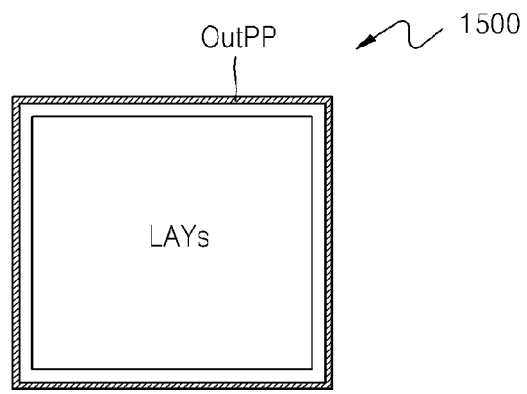
FIG. 15 is a view of another example of the semiconductor memory device of FIG. 1.

FIG. 15 is a view of another example of the semiconductor memory device 100 of FIG. 1(a).

Figure 16:
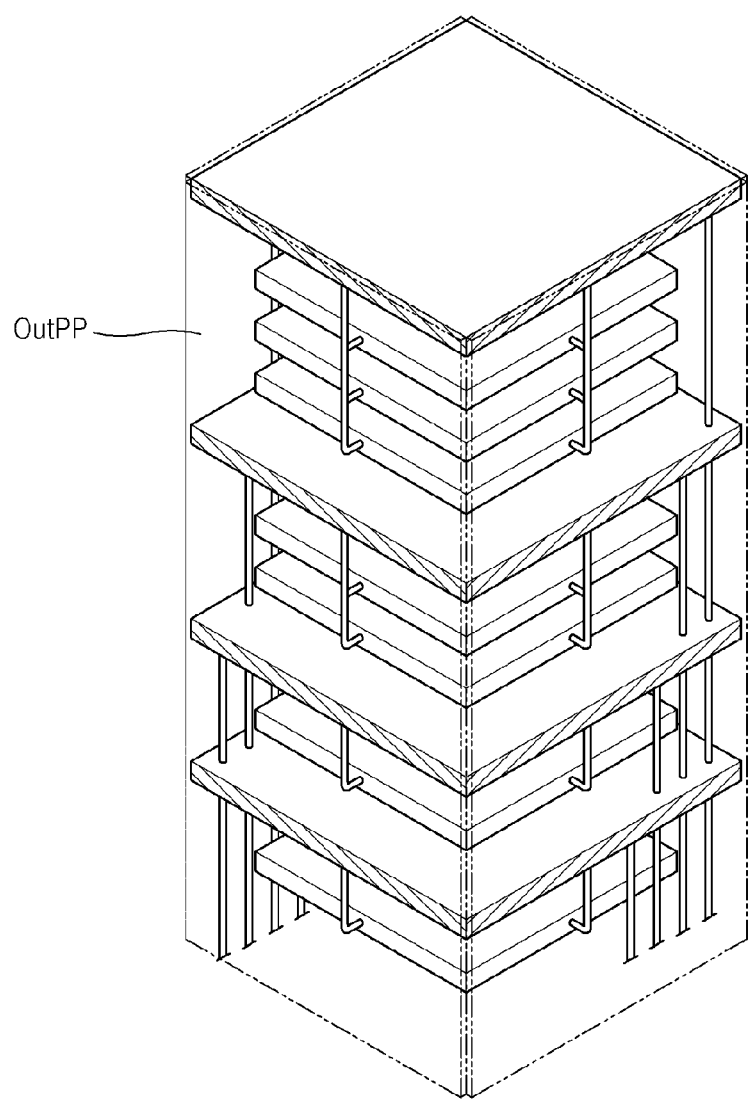
FIGS. 16 through 19 are views of examples of power planes disposed outside the layers of FIG. 15.

Referring to FIG. 15, a semiconductor memory device 1500 according to this example embodiment includes stacked layers LAYs and a power plane OutPP surrounding the stacked layers LAYs. The power plane OutPP surrounding the stacked layers LAYs illustrated in FIG. 15, as illustrated in FIG. 1(b), may be formed such that a region to which a ground voltage VSS is applied and a region to which a power voltage VDD is applied are alternately aligned on the same plane and a decoupling capacitor DCAP is formed between the region to which a ground voltage VSS is applied and the region to which a power voltage VDD is applied. In this regard, as illustrated in FIG. 16, the semiconductor memory device 1500 of FIG. 15 may include the power plane OutPP as illustrated in FIG. 1(b) outside the stacked layers LAYs.

Figure 17:
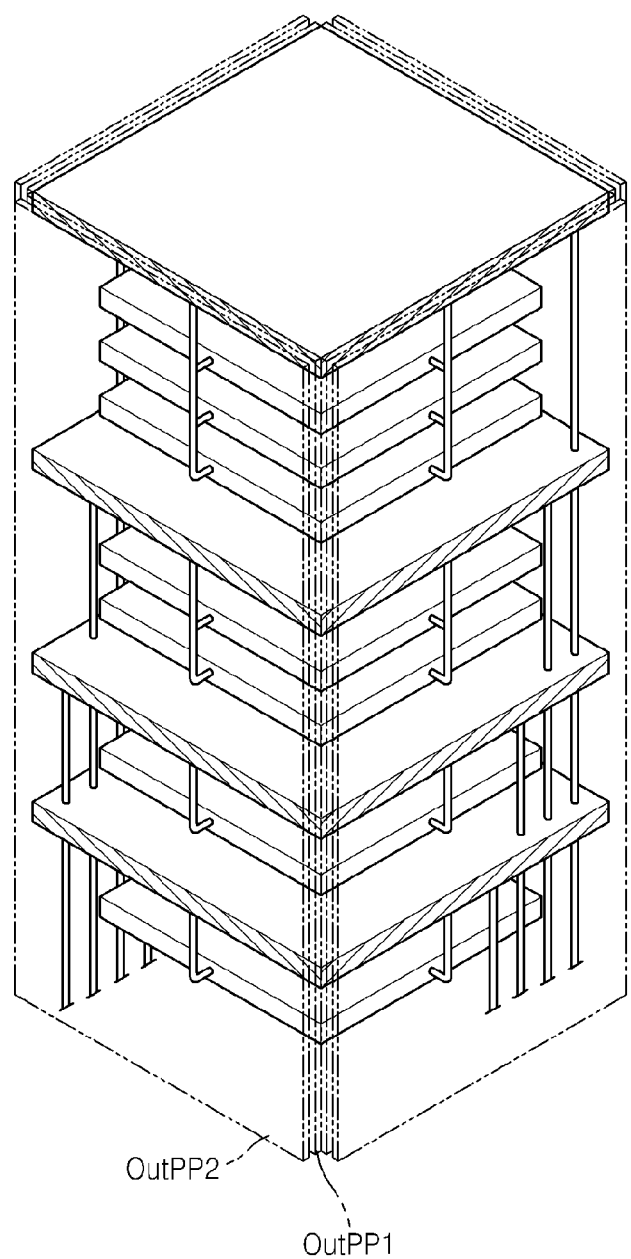

Alternatively, the power plane OutPP surrounding the stacked layers LAYs illustrated in FIG. 15 may be formed, as illustrated in FIG. 2(a), such that a layer to which a power voltage is applied is located adjacent to a layer to which a ground voltage is applied, thereby forming a decoupling capacitor between the two layers (see OutPP1 and OutPP2 of FIG. 17). In this case, as illustrated in FIG. 17, in the semiconductor memory device 1500 of FIG. 15, the stacked layers LAYs may be surrounded by power planes OutPP1 and OutPP2, each of which has the same structure as illustrated in FIG. 2(a).

Figure 18:
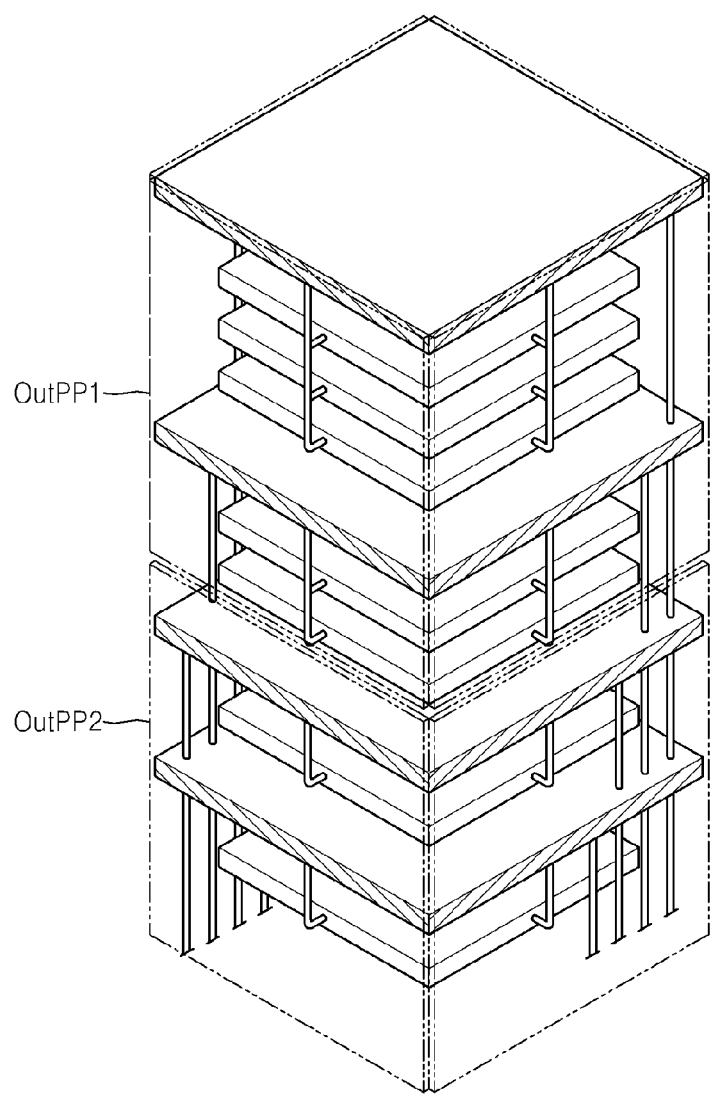

Alternatively, the power plane OutPP surrounding the stacked layers LAYs illustrated in FIG. 15 may be formed, as illustrated in FIG. 2(b), such that the power plane OutPP is divided into a region OutPP1 to which a power voltage is applied and a region OutPP2 to which a ground voltage is applied, thereby forming a decoupling capacitor between the divided neighboring regions. In this regard, as illustrated in FIG. 18, in the semiconductor memory device 1500 of FIG. 15, the power planes OutPP1 and OutPP2 having the same structure as illustrated in FIG. 2(b) may be provided corresponding to each side of the stacked layers LAYs outside the stacked layers LAYs.

Figure 19:
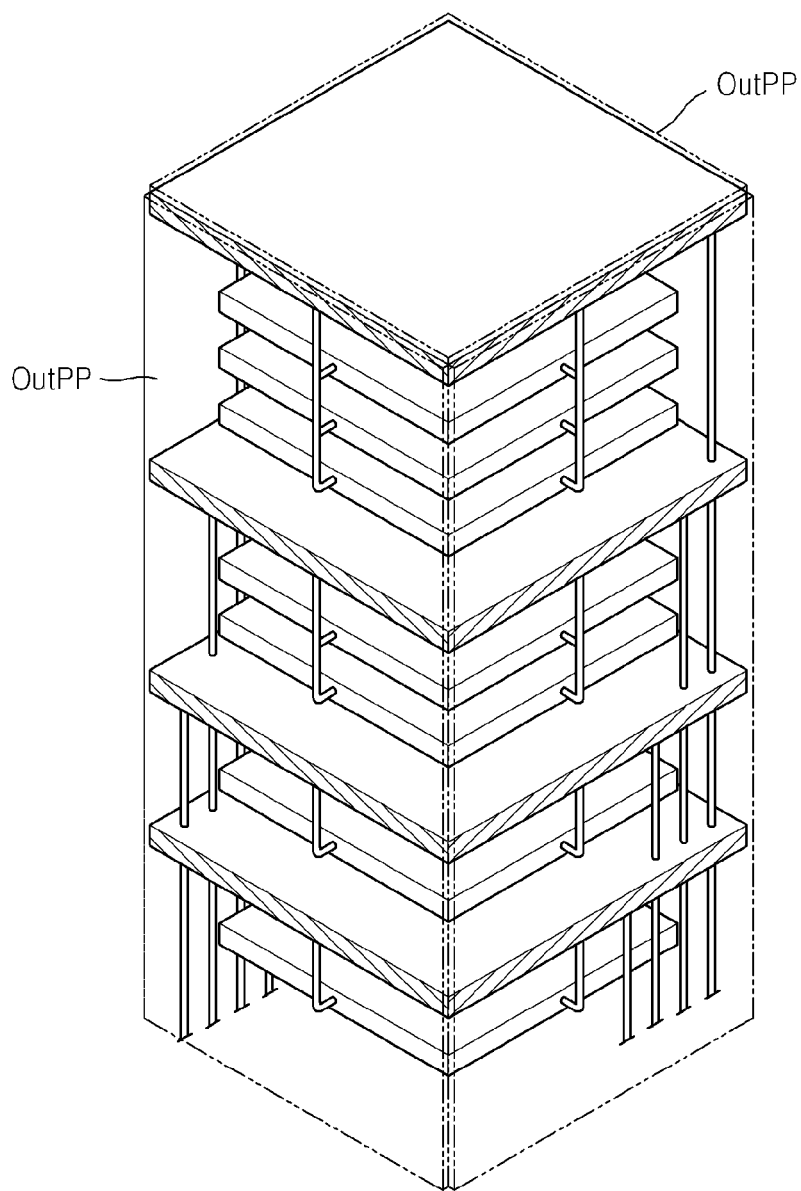

Furthermore, as illustrated in FIG. 19, in the semiconductor memory device 1500 of FIG. 15, a power plane OutPP may also be formed on the or over the top of stacked layers LAYs. Alternatively, although not shown, a power plane may surround only a portion of the stacked layers LAYs.

As described above, a semiconductor memory device according to an example embodiment of the inventive concepts may be capable of preventing generation or influx of power noise due to formation of a power plane outside stacked layers.

Furthermore, a semiconductor memory device according to an example embodiment of the inventive concepts may include, in addition to a power plane disposed outside stacked layers as illustrated in FIG. 15, a power plane disposed between layer groups as described with reference to FIG. 3. In addition, a semiconductor memory device according to an example embodiment of the inventive concepts may include, in addition to a power plane disposed outside stacked layers as illustrated in FIG. 15, a ground plane, as described with reference to FIG. 13, disposed either outside the stacked layers or between layers (or layer groups). The alternative embodiments should be straightforward in view of the descriptions presented in connection with FIGS. 3, 13, and 15, so that detailed description may thus be omitted.

Figure 20:
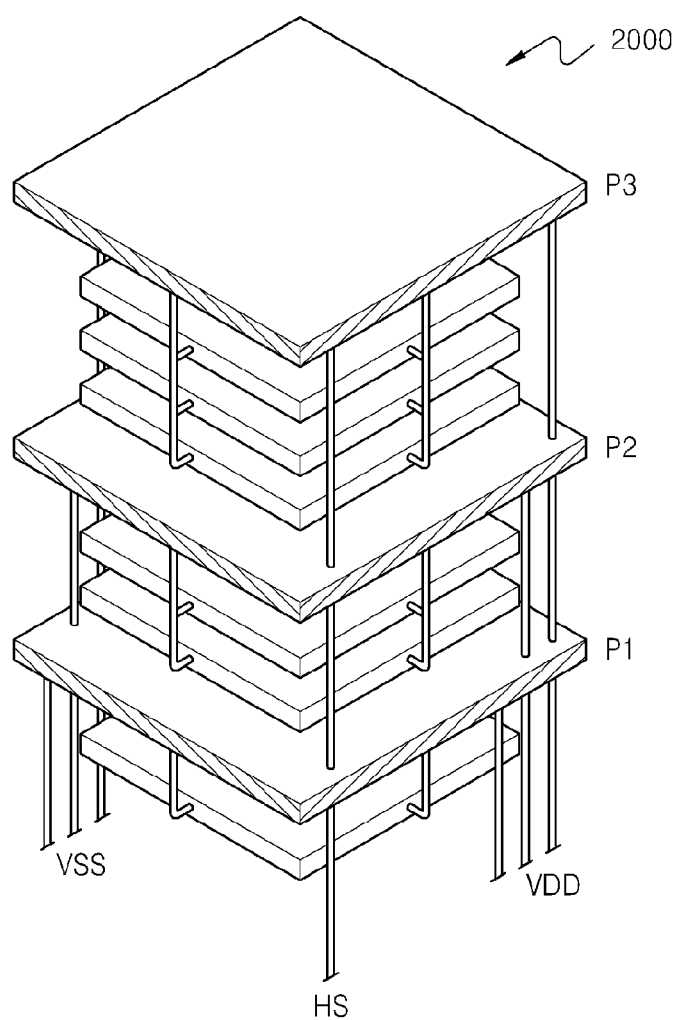
FIG. 20 is a view of another example of the semiconductor memory device of FIG. 1.

FIG. 20 is a view of another example embodiment of a semiconductor memory device such as described with respect to FIG. 1(a). Referring to FIG. 20, a semiconductor memory device 2000 according to this example embodiment includes a heat sink HS that dissipates heat from the power planes P1 through P3. The heat sink HS may be connected to a small thermal register (not shown) included in each of the power planes P1 through P3. However, according to other embodiments, the semiconductor memory device 2000 may not include the heat sink HS, thereby reducing a layout area.

Figure 21:
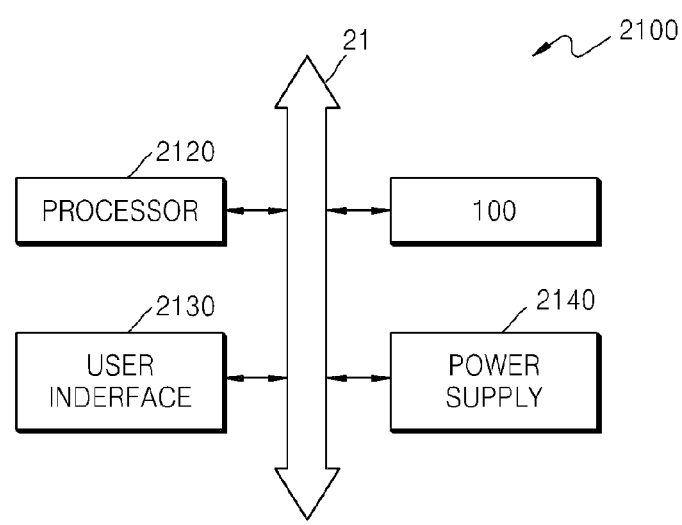
FIG. 21 is a block diagram of a computing system device including a semiconductor memory device, according to an embodiment of the inventive concept.

FIG. 21 is a block diagram of a computing system device 2100 including a semiconductor memory device 100, according to an example embodiment of the inventive concepts.

The computing system device 2100 according to this example embodiment includes a processor 2120, a user interface 2130, and the semiconductor memory device 100, electrically connected to a bus 21. The semiconductor memory device 100 may be one of the semiconductor memory devices described according to the previous example embodiments. The semiconductor memory device 100 may store N-bit data (N is an integral number equal to or greater than 1) that is treated or is to be treated by the processor 2120. The computing system device 2100 may further include a power supply device 2140 for applying a power voltage VDD and a ground voltage VSS to a corresponding power plane.

Figure 22:
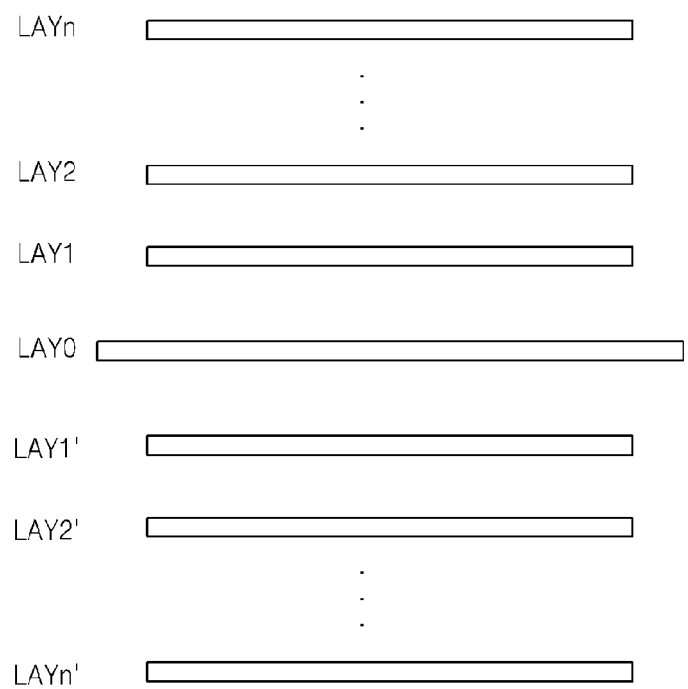
FIG. 22 is a view of another example of the semiconductor memory device of FIG. 1.

As described above, example embodiments are disclosed in the drawings and the specification. The terms used herein are for illustrative purposes only and are not intended to limit the scope of the inventive concepts. For example, in FIG. 1, a control layer is a lowermost layer, but the inventive concepts are not limited thereto. Furthermore, as illustrated in FIG. 22, a control layer LAY0 may be disposed between storage layers LAY1 through LAYn and storage layers LAY1' through LAYn'. In addition, it should be understood that the previously described example embodiments may be combined in various other ways not specifically described to provide additional example embodiments without departing from the spirit and scope of ther inventive concepts. For example, stacked layers are surrounded by a power plane as illustrated in FIG. 16 and power may be supplied to a control layer as illustrated in FIG. 12.

While the inventive concepts have been particularly shown and described with reference to exemplary embodiments thereof, it will be understood that various changes in form and details may be made therein without departing from the spirit and scope of the following claims.

What is claimed is:

1. A semiconductor memory device comprising:
 a plurality of layers each comprising a memory cell array, the layers stacked over each other;
 at least one power plane for supplying power to the layers, wherein the at least one power plane includes a first region to which a power voltage is applied and a second region to which a ground voltage is applied, and
 wherein the first region is located adjacent to the second region, and the first and second regions form a decoupling capacitor there between to decouple an influx of power noise to the layers and decouple generation of power noise in the layers;
 a control layer that includes control logic for controlling access to the memory cell arrays of the layers; and
 a memory array driving circuit for driving the memory cell arrays of the layers.

2. The semiconductor memory device of claim 1, wherein in the at least one power plane, the first region and the second region are in a same layer.

3. The semiconductor memory device of claim 2, wherein the first region and the second region are alternately aligned in the same layer, interlaced with each other.

4. The semiconductor memory device of claim 1, wherein the layers comprise layers having different driving characteristics in terms of a memory capacity, access time, or a combination thereof, and the at least one power plane is interposed between the layers having different driving characteristics.

5. The semiconductor memory device of claim 1, wherein when the layers are divided into a plurality of layer groups according to driving characteristics, the at least one power plane is interposed between neighboring layer groups from among the layers.

6. The semiconductor memory device of claim 1, wherein the at least one power plane surrounds a portion of the stacked layers, or completely surrounds the stacked layers.

7. The semiconductor memory device of claim 1, wherein the at least one power plane is interposed between layers having different driving characteristics in terms of a memory capacity, access time, or a combination thereof, and surrounds a portion of the stacked layers, or completely surrounds the stacked layers.

8. The semiconductor memory device of claim 1, further comprising a control power plane for supplying power to the control layer,
 wherein the control power plane is interposed between the control layer and a layer from among the layers disposed closet to the control layer.

9. The semiconductor memory device of claim 1,
 wherein the power voltage and the ground voltage are directly applied to the control logic of the control layer, and
 the power voltage and the ground voltage are applied to the memory array driving circuit of the control layer through a control power plane for supplying power to the control layer, wherein the control power plane is interposed between the control layer and a layer from among the layers disposed closet to the control layer.

10. The semiconductor memory device of claim 1, further comprising at least one ground plane interposed between two layers of the layers and to which the ground voltage is applied.

11. The semiconductor memory device of claim 10, wherein the ground plane is disposed adjacent to the at least one power plane.

12. The semiconductor memory device of claim 1, further comprising a heat dissipation path which runs from the at least one power plane to outside the semiconductor memory device.

13. The semiconductor memory device of claim 1, wherein the power voltage and the ground voltage applied from the at least one power plane is supplied from a power supply device disposed outside the semiconductor memory device.

14. The semiconductor memory device of claim 1, further comprising:
 a power line and a ground line through which the power voltage and the ground voltage are supplied to the power plane,
 the power line and the ground line are connected to a side or sides of the at least one power plane.

15. The semiconductor memory device of claim 14, comprising a plurality of the power planes, wherein the power line and the ground line are commonly shared by the plurality of power planes.

16. The semiconductor memory device of claim 14, comprising a plurality of the power planes,
 wherein the power line and the ground line are allocated to each of the plurality of power planes, and the power line and the ground line are through-silicon-vias that are connected to a power plane of the plurality of power planes disposed higher than other of the plurality of power planes.

17. A semiconductor memory device comprising:

a plurality of layers each comprising a memory cell array, the layers stacked over each other; and at least one power plane for supplying power to the layers, wherein the at least one power plane includes a first region to which a power voltage is applied and a second region to which a ground voltage is applied, wherein the first region is located adjacent to the second region, and the first and second regions form a decoupling capacitor there between to decouple an influx of power noise to the layers and decouple generation of power noise in the layers, and wherein in the at least one power plane, the first region and the second region are in different layers.

18. A computing system including a semiconductor memory device comprising:

a plurality of layers each comprising a memory cell array, the layers stacked over each other;

at least one power plane for supplying power to the layers, wherein the at least one power plane comprises a first region to which a power voltage is applied and a second region to which a ground voltage is applied, and wherein the first region is located adjacent to the second region, and the first and second regions form a decoupling capacitor there between to decouple an influx of power noise to the layers and decouple generation of power noise in the layers; and a power line and a ground line through which the power voltage and the ground voltage are supplied to the power plane, the power line and the ground line are connected to a side or sides of the at least one power plane.

* * * * *